United States Patent
Zheng et al.

[19]

[11] Patent Number: 5,999,019
[45] Date of Patent: Dec. 7, 1999

[54] FAST CMOS LOGIC CIRCUIT WITH CRITICAL VOLTAGE TRANSITION LOGIC

[75] Inventors: Zhu Zheng, Stony Brook; Bradley S. Carlson, Huntington Station, both of N.Y.

[73] Assignee: The Research Foundation of State University of New York, Stony Brook, N.Y.

[21] Appl. No.: 08/949,216

[22] Filed: Oct. 10, 1997

[51] Int. Cl.[6] .......................... H03K 19/096; H03K 19/00; H03K 19/094; H03K 19/01
[52] U.S. Cl. ................................. 326/98; 326/95; 326/17; 326/83; 326/86; 326/93
[58] Field of Search .................................. 326/95, 98, 17, 326/83, 86, 121, 119, 93

[56] References Cited

U.S. PATENT DOCUMENTS

| | | | |
|---|---|---|---|
| 4,040,015 | 8/1977 | Fukuda | 326/98 |
| 4,972,101 | 11/1990 | Partovi et al. | |
| 5,028,818 | 7/1991 | Go Ang et al. | |
| 5,059,828 | 10/1991 | Tanagawa | 326/98 |
| 5,191,555 | 3/1993 | Tabacco et al. | |
| 5,378,942 | 1/1995 | Wu et al. | 326/21 |
| 5,621,360 | 4/1997 | Huang | |
| 5,623,437 | 4/1997 | Nogle et al. | |
| 5,627,487 | 5/1997 | Keeth | |
| 5,646,557 | 7/1997 | Runyon et al. | 326/96 |

*Primary Examiner*—Michael Tokar
*Assistant Examiner*—James H. Cho
*Attorney, Agent, or Firm*—Baker & Botts, L.L.P.

[57] ABSTRACT

A CMOS Critical Voltage Transition Logic device which reduces propagation delays in a circuit by preconditioning the voltage outputs of each stage of the circuit to a critical voltage value which is between the logic high and logic low values for the circuit. The transition time to achieve either the high or low logic output states which is responsive to the input signal from the previous stage is reduced due to the preconditioning. Each stage is synchronously clocked in order to achieve the preconditioned state in each stage before processing the input signal for the previous stage. This unique switching characteristic greatly reduces the propagation delay in the circuit.

21 Claims, 12 Drawing Sheets

FAST CMOS LOGIC CIRCUIT WITH CRITICAL VOLTAGE TRANSITION LOGIC

FIELD OF INVENTION

The present invention is directed towards a new CMOS logic circuit design which operates faster than conventional CMOS circuits by reducing propagation delays within the circuit.

BACKGROUND OF THE INVENTION

Metal-oxide semiconductors (MOS) are used for transistor devices in all types of electronic circuits designed today. A complementary MOS circuit (CMOS) connects a p-channel and an n-channel MOS transistor in a manner in which the input signal to the circuit is complemented and thereby performs an inverter function. The gates of the transistors in a conventional CMOS circuit are both connected to the input signal to the circuit. The collector ("drain") of one of transistors is connected to the ("drain") of the other transistor. The emitter ("source") of the p-channel transistor is connected to a logic high voltage source and the source of the n-channel transistor is connected to ground. When the p-channel transistor is on, the n-channel transistor is off and vice-versa. The output of the circuit therefore complements the input signal. In general the two transistors can be replaced with networks of transistors to realize other logic operations. Such a circuit is called a CMOS gate (or "device") of which the inverter is a special case.

The CMOS gate design is advantageous because it has extremely low power consumption. The low power consumption is an important reason why CMOS circuits are popular in calculators, digital watches and satellites, among other devices. CMOS technology is also advantageous in driver circuits, buffers, adders, microprocessors, memories and application specific integrated circuits. It is desirable to increase the speed of CMOS technology in order to speed up the circuit operation with respect to both circuit and device design. One way in which early CMOS circuits have become faster is by reducing the size of the CMOS circuits on the fabricated chip and therefore reducing the time required for a signal to travel within the circuit. While the speed of CMOS circuits have increased with this technique, the scaling of the size of the CMOS technology has many undesirable effects such as carrier drift, velocity saturation, trapping of hot carriers in the gate oxide and source-drain punch-through that have the effect of prohibiting substantially shorter channel lengths. These effects create a practical limitation on the minimum size of the CMOS circuits. Therefore, it would be desirable to improve the speed of the CMOS technology through a new circuit design.

The currently available CMOS logic circuit designs have similar operation speeds and one CMOS circuit does not have a significant speed advantage over another. Conventional circuit designs include complementary static logic, pseudo-NMOS logic, CMOS dynamic logic, transmission gate logic and CVSL logic. All the above logic circuits have substantially the same delay propagation mechanism between circuit stages. A stage is a distinct circuit element used in the circuit, e.g., an inverter stage. For a conventional CMOS circuit, the inverter stage includes the p-channel and n-channel transistors and their connectors. The output of the logic stages for conventional circuits switches from either $V_{ss}$ (logic low) to $V_{dd}$ (logic high) or vice-versa in response to an input signal. Due to the output load capacitance of the stage, the circuit requires the entire rising time $t_r$ or the entire falling time $t_f$ to make the entire transition between the logic states. In other words, the delay is produced by the $t_r$ or $t_f$ which is the time needed for the stage output to switch from rail to rail. The majority of this switching time from extreme levels of voltage is not utilized in the circuit and simply slows the operation. For example, if the input to a static CMOS inverter switches from logic low $V_{ss}$ to logic high $V_{dd}$, the inverter output does not begin its transition until the input reaches 75% of $V_{dd}$. Therefore, approximately 75% of the rise time is not utilized in the circuit operation.

It would be advantageous to design a circuit which could reduce the unproductive propagation delay time in the CMOS logic circuits and therefore increase the speed and efficiency of the overall circuit.

SUMMARY OF THE INVENTION

A new CMOS device which decreases propagation delays includes two complementary transistors which are coupled together where the first transistor's gate is connected to a clock signal and pre-charges the output of the device to a critical voltage which is between the logic low and logic high voltages. The second transistor's gate is connected to the input signal for the device and subsequently drives the output to either logic high or logic low depending upon the input signal. The preconditioning of the output reduces the time it takes to achieve the final output state.

Also included in the new CMOS device is a reset transistor which resets the output of the device to zero or a low logic level before the input signal is processed. The gate of the reset transistor is also connected to the clock signal.

An additional transistor and capacitor can be connected to the device output to help cause the output voltage to be preconditioned to the critical voltage and reduce distortions. These enhanced devices can be placed as appropriate in a chain of new CMOS devices to smooth the distortions as needed.

The CMOS device can be as simple as an inverter circuit or can include more complex circuitry to perform other functions. Each gate which uses the inventive design can be one stage in a chain of gates to form a buffer or other logic function.

BRIEF DESCRIPTION OF THE DRAWINGS

Further objects, features and advantages of the invention will become apparent from the following detailed description taken in conjunction with the accompanying drawings showing a preferred embodiment of the invention, in which.

DETAILED DESCRIPTION OF PREFERRED EMBODIMENTS

The new CMOS logic design as described herein is referred to as Critical Voltage Transition Logic ("CVTL"). The CVTL circuits are implemented by preconditioning the outputs of each CMOS device stage to a level that is between $V_{dd}$ (logic high) and $V_{ss}$ (logic low) and by using a new clocking scheme in the circuit design. The CVTL devices respond much quicker to changes to the input of the CMOS device compared to conventional CMOS circuits. The CVTL design allows for larger circuits which include one or more of the CVTL stages which can operate at greater speeds than conventional CMOS circuits. Throughout the application, the terms "device", "stage" and "circuit" simply refers to circuitry incorporating the CVTL design and does not restrict the design in any way. The CVTL logic design can be used in many different types of circuits. An exemplary circuit is a chain of CVTL inverters and is shown in FIG. 1.

Figure 1:
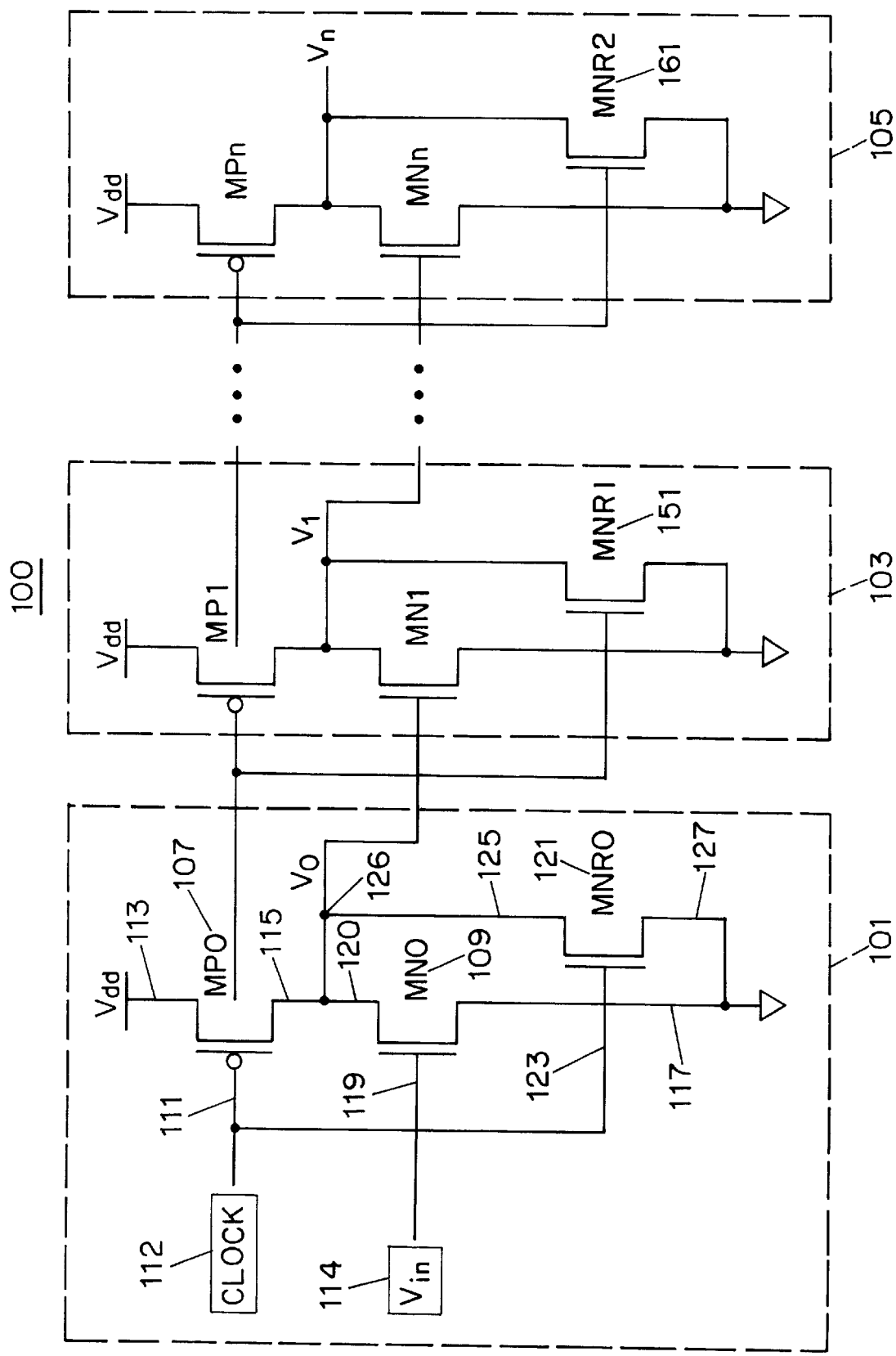
FIG. 1 is a schematic diagram of a critical voltage transition logic ("CVTL") stage implemented in a chain of inverters.

FIG. 1 is a schematic diagram of a CMOS logic circuit implemented using a chain of CVTL inverter stages. The circuit 100 includes a number of CVTL inverter stages connected in sequence. Stages 101, 103 and 105 are shown in the figure. The circuit may contain any number of stages; the actual number will be determined by the overall circuit requirements. Each stage in the chain has common components and has the same CVTL circuit design, although individual characteristics of those components may vary (e.g., transistor geometries). Referring to the first stage 101, MP0 107 and MN0 109 are complementary transistors (a p-channel and an n-channel, respectively) which form the nucleus of the inverter. The size ratio of the transistors is similar to a conventional pseudo-NMOS inverter. Each transistor has a gate (or base) 111 or 119, a drain (or collector) 115 or 120 and a source (or emitter) 113 or 117. The source 113 of MP0 107 (and the MP transistors in each subsequent stage) is connected to $V_{dd}$ which is logic high. An example of a $V_{dd}$ level is five volts. The drain 115 of the MP0 107 transistor is connected to the drain 120 of the MN0 109 transistor. The gate 111 of the MP0 107 transistor (and the MP transistor in each subsequent stage) is connected to a clock signal 112. The clock signal 112 will cycle the input signal through the inverter chain. The gate 119 of the MN0 109 transistor in each stage is connected to the input signal $V_{in}$ 114. The source 117 of the MN0 109 transistor is connected to $V_{ss}$ which could be ground or some other low voltage representing logic low. Also present in each stage is transistor MNR. MNR0 121 is included in the first stage 101. The purpose of the MNR transistor is to reset all of the gate outputs to ground (or logic low) so that the stages can be preconditioned to a critical voltage prior to the output being driven to logic high or low based on the input to the stage. The point after reset in which the output is driven towards its final state is called the evaluation stage. The gate 123 of MNR is also connected to the clock 112, the drain 127 is connected to V0 126 (the output of the stage) and the source of MNR is connected to $V_{ss}$ (which is ground in this described embodiment). The reset transistor MNR0 121 is used to allow the circuit to achieve the preconditional critical voltage for processing each input signal through the chain. The output V0 126 is the inverse of the input signal $V_{in}$ as required by an inverter circuit. The other CVTL stages 103 and 105 are configured in the same manner as stage 101. The clock 112 triggers all of the MP and MNR transistors and the output of one stage drives the input of the next stage.

Referring to FIG. 1, when the clock is high, all of the reset MNR transistors 121, 151 and 161 are turned on and any output voltages which exist at the output of the stages are discharged to ground. The size of the MNR transistors should be selected such that all of the outputs can be reset in a reasonable time and the sizes of the MN and MP transistors are the same for all of the CVTL inverters in FIG. 1. When the clock signal falls from its logic high state ($V_{dd}$) to ground, the circuit 100 is activated and the signal $V_{in}$ in is passed through each of the stages in succession with each stage inverting the output of the previous stage. The same clock signal activates each of the stages at the same time so that subsequent stages will achieve the critical voltage as further explained in FIG. 2.

Figure 2:
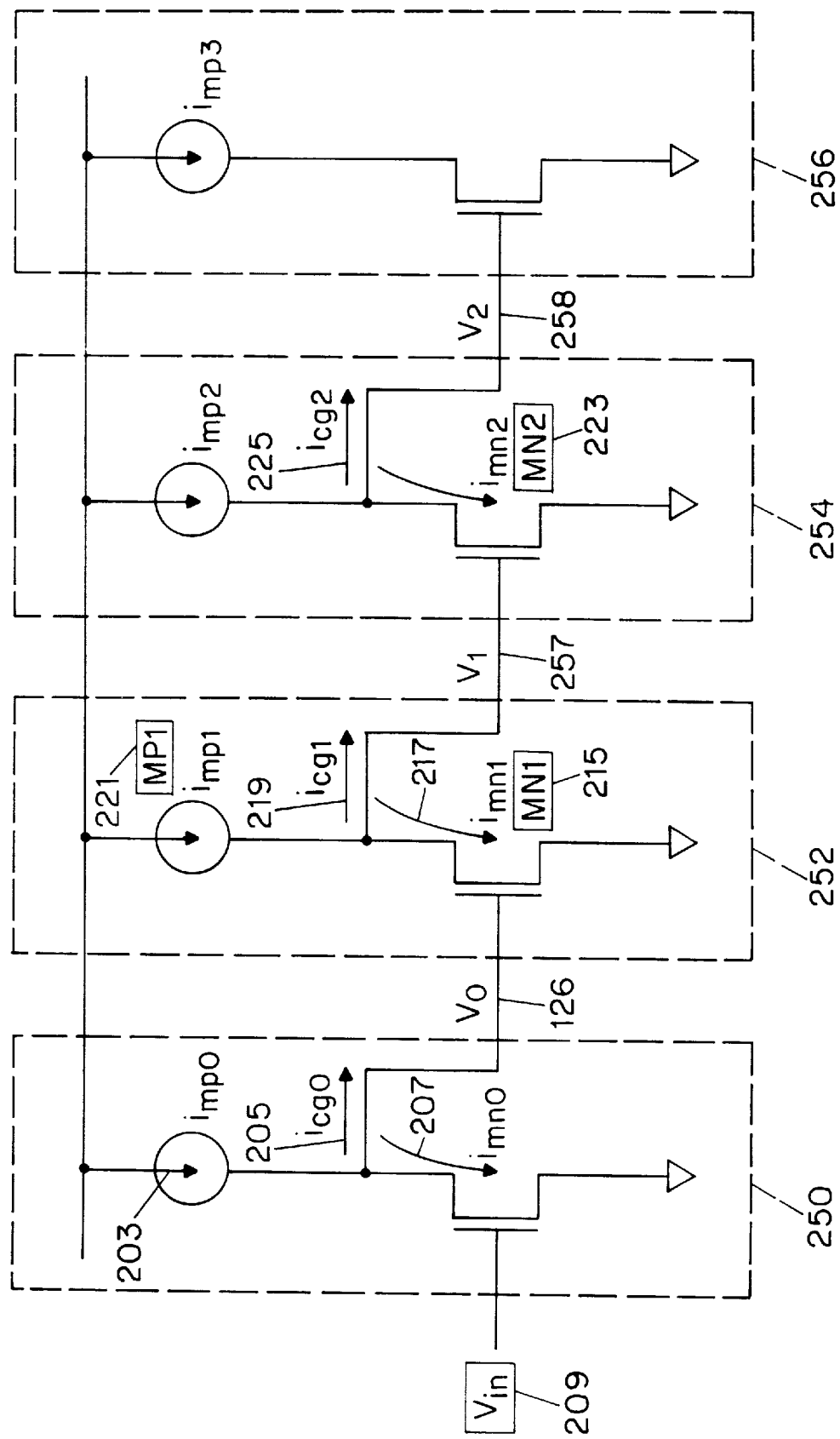
FIG. 2 is a further diagram of FIG. 1 which illustrates current flow.

FIG. 2 shows an equivalent representation of the circuit in FIG. 1 after the circuit has been reset and is in its "evaluation" phase. The reset transistors MNR 121, 151 and 161 are not used in the evaluation phase. FIG. 2 shows the current flows present in the inverter chain when the clock goes from high to low. Three currents are shown for each CVTL stage: the current 203 passing through the transistor MP 107 ($i_{MP0}$), the current 205 flowing to the stage output 126 ($i_{cg0}$) and the current 207 flowing through the MN 109 transistor ($i_{mn0}$) are shown for stage 250. If the primary input $V_{in}$ 209 to the first inverter stage 250 is low, then transistor MN0 109 is turned off and transistor MP0 107 is switched on. Transistor MP0 107 then charges the input gate capacitance of the MN transistor in the next stage. The output of the first inverter stage 126 will thus switch from zero (the reset state) to $V_{dd}$.

The output of the next CVTL inverter stage 252 will rise from zero (the reset state) to $V_{tn}$ at a time $t_t$ at the same rate as V0 126. Once the input to the gate of a stage other than the first stage raises to a level $V_{tn}$, the transistor MN, e.g., MN1 215, turns on and current starts to flow through the transistor. After the time $t_t$, V0 increases and therefore the current flowing through MN1 215 in the adjacent stage correspondingly increases. The current $i_{mn1}$ 217 then decreases the current $i_{cg1}$ 219 charging the gate capacitance of the next gate in the next stage by drawing off the current. When V0(t) reaches a voltage such that the currents of MN1 215 and MP1 221 are equal, V1(t) 257 reaches its peak. After this point, the current of MN1 215 is larger than MP1 221 and V(1)(t) 257 begins to decrease to a logic zero voltage level. Since the size ratio of MP and MN transistors is similar to pseudo-NMOS, V1(t) is forced to $V_{low}$ which is normally below $V_{tn}$ (threshold voltage of an NFET).

After V2(t) 258 rises to Vtn at $t_t$ it continues to rise. The output voltage V2 258 of the third stage 254 is less than or equal to the output voltage V0 126 of the first stage 250 since there is some current $i_{mn2}$ 223 which is caused by the output V1 257 of the second stage 252 and which reduces the current $i_{cg2}$ 225 flowing to the output of the second stage 254. However, because the transistor MN2 223 is biased more than MN1 215, the output voltage of the third stage 254 is greater than that of the second stage 252. When an output voltage in an even number stage is a logic low voltage with a negligible output, the next stage will act much like the transistors in the first stage.

Figure 3:
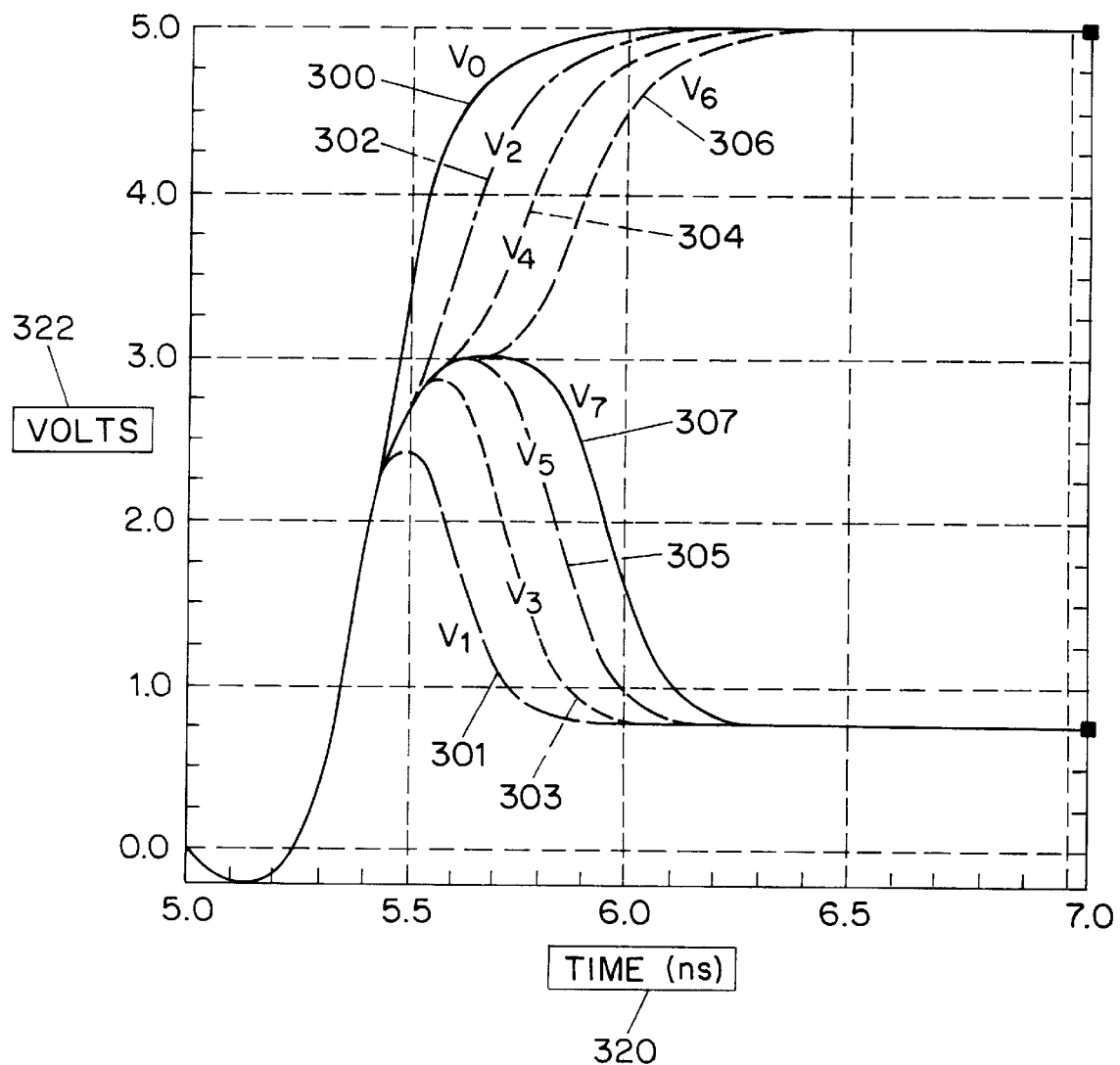
FIG. 3 is a graph of a typical waveform generated from the CVTL inverter chain of FIG. 1.

FIG. 3 shows a graph of typical waveform of the outputs of the stages in the CVTL inverter chain shown in FIG. 1. The horizontal axis 320 of the graph represents time in nanoseconds from when the circuit is activated and the vertical axis 322 represents the output in volts. The reset phase has ended near the five nanosecond mark. In this example, $V_{dd}$ (high logic level) is 5 volts, $V_{10}$ (low logic level) is approximately 0.8 volts and $V_c$ (the critical voltage to which the stages are preconditioned) is three volts. The outputs of stages one through eight are shown on the graph. As shown in the graph, for each stage, the voltage outputs rise to a particular voltage (around 3 volts) and then are driven to logic levels high or low depending upon if the stage is an even or odd stage. $V_0$ 300, $V_2$ 302, $V_4$, 304 and $V_6$ 306 all obtain a logic level high state when a low input value is applied to the circuit and after the circuit is reset. $V_1$ 301, $V_3$ 303, $V_5$ 305 and $V_7$ 307 all obtain a low logic level state after initially being brought to the $V_c$ level of 3 volts.

Figure 4:
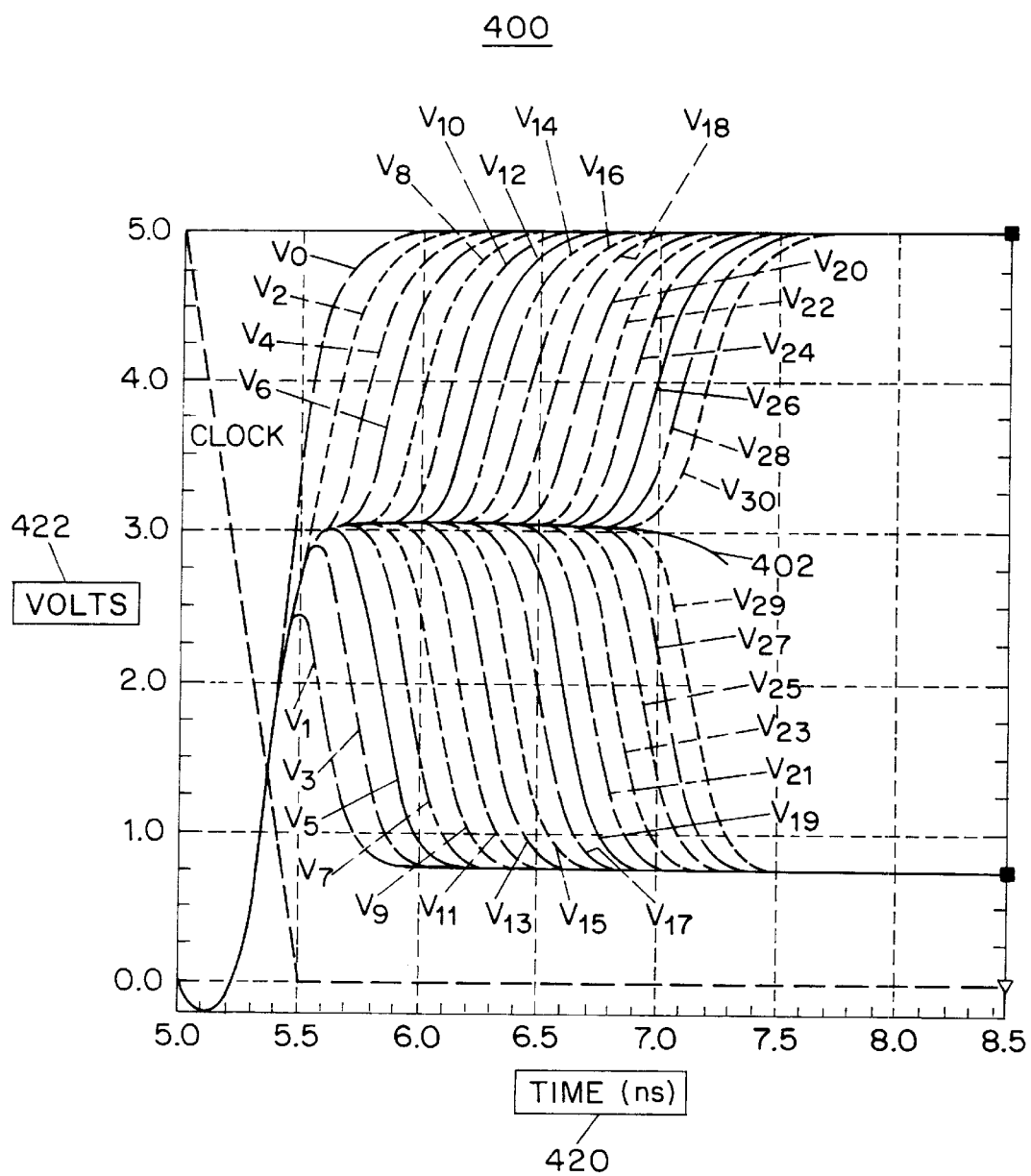
FIG. 4 is a graph of the output voltage of each stage of the inverter chain made in accordance with the invention.

FIG. 4 shows a graph 400 of the output voltages of a CVTL inverter chain with 31 stages. The horizontal axis 420 of the graph represents time in nanoseconds from when the circuit is activated and the vertical axis 422 represents the output in volts. The graph is generated from an ideal circuit model, where all the transistors parameters are equal and there is no loss of power or noise in the circuit. This graph shows that all the CVTL stages are brought (i.e. preconditioned) to a critical voltage $V_c$ 402 before they are caused to obtain either a logic low or logic high level. The time delay shown in the graph of transitioning from the critical voltage to the logic state is due to the propagation delay of the input signal propagated through the chain. As seen in the figure, all of the stages are preconditioned at the same time. In the case of the inverter stages with a logic high input, all the even number stages are driven to a high logic level and all the odd number stages are driven to the low logic level. However, any inverter stage could be replaced with a differently configured circuit design which could cause the output to be driven to either logic state. The only requirement for a CVTL chain design is that the output of each be conditioned to a critical voltage between the high and low logic state prior to each stage being driven to its final logical state for a given input. The first stage will not achieve the same critical voltage because the input signal will have an immediate effect on its output.

The time distance between two adjacent rising curves in the graph represents the propagation delay between two inverters achieving the same logic state. The delay for the two stages is a combined 0.1 ns as shown in the figure for this specific CMOS process. Therefore, the delay of one stage is only 0.05 ns. Conventional static inverter chains have at least five times that delay. The switching mechanism which preconditions each stage's output in the new inverter chain makes the CVTL chain significantly faster than conventional chains. As long as the input to the inverter is larger than $V_c$ indicating a logic high input, its source to drain current for the MN transistor is larger than the source to drain current for the MP transistor which causes the inverter stage to discharge its load capacitance and the output falls to a low logic level immediately. If the input is lower than $V_c$ indicating a logic low input, then the inverter charges the load capacitance and the output rises. Therefore, the response time is much quicker compared to a conventional inverter where the inverter stage has to wait for the input to rise or fall to some significant value to begin discharging or charging the load capacitance.

In summary, $V_{2i-1}(t)$, the output of the odd number stages, which is a low logic value when the primary input $V_{in}$ is logic low, rises to a critical voltage $V_c$ and stays there for some time before falling to $V_{ss}$. $V_{2i}(t)$, the output of the even number stages, which is a logic value high, rises to $V_c$ and stays there for some time before rising to $V_{dd}$. All of the inverter outputs rise to the critical voltage $V_c$ and make their transition to $V_{dd}$ or $V_{ss}$ from $V_c$. $V_c$ is a voltage level between $V_{dd}$ and $V_{ss}$ and is preferably $(V_{dd}-V_{ss})/2$. The response time of the stage is thus reduced if the output voltage of each stage is preconditioned to $V_c$ and the transistors do not need the lead time to obtain $V_c$ before settling into their final voltage.

As shown above, the new logic CVTL devices are activated by the falling edge of the clock. Existing CMOS logic gates are activated by an input signal. If the clocks for the MP transistors and MNR reset transistors are designed with different phases the results are latched at the clock's rising edge. This characteristic allows pipeline architecture to be implemented very effectively using the CVTL logic.

Figure 5:
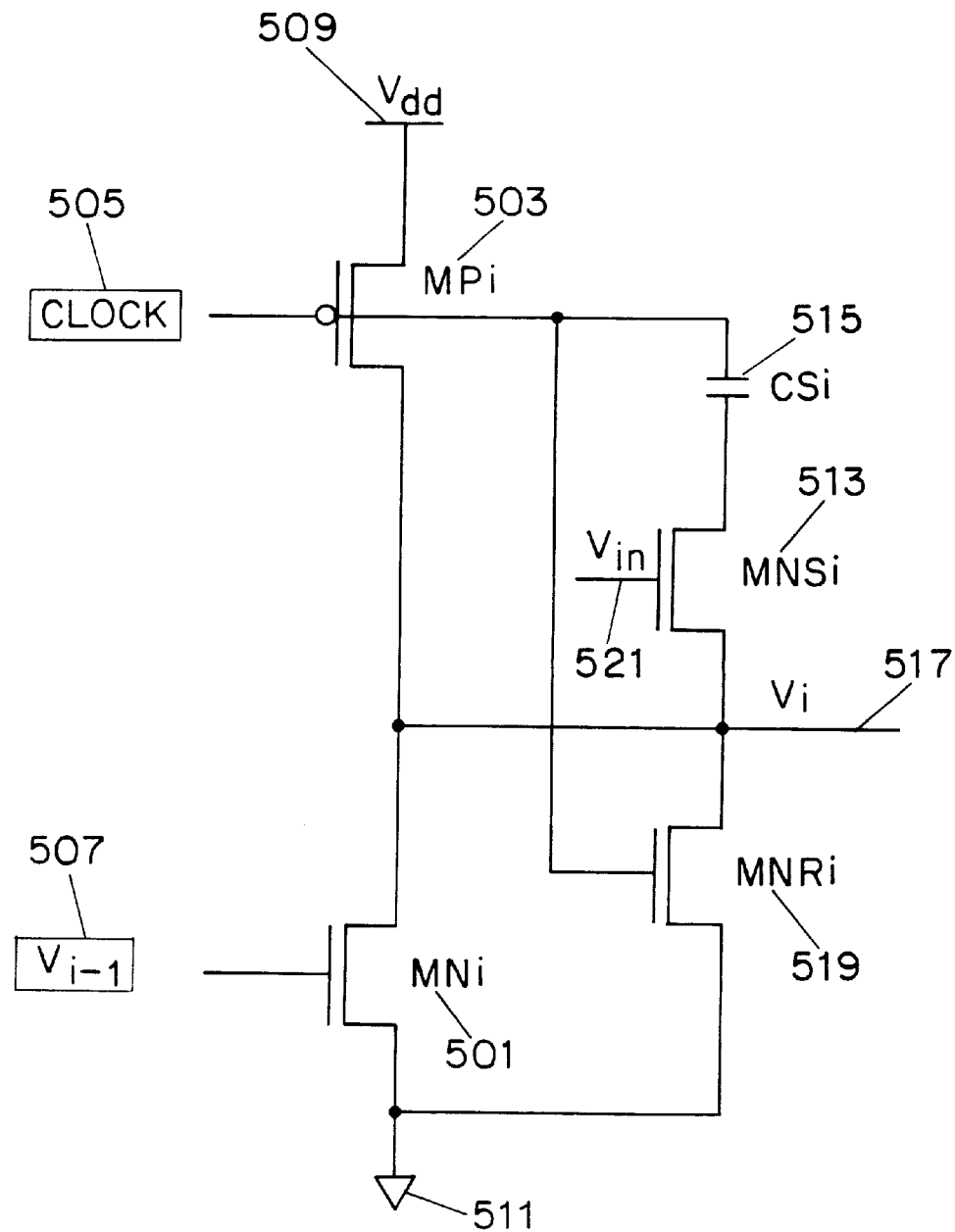
FIG. 5 is an alternate embodiment of the CVTL stage with an additional transistor.

FIG. 5 is another embodiment of the CVTL logic circuit with an additional transistor. An addition of an additional transistor and capacitor is used to reduce the delay in a particular stage and solve device mismatch problems that occur between stages. FIG. 5 is a schematic diagram of the enhanced CVTL circuit. The designation "i" represents a particular stage. Transistor MNi 501 (n-channel transistor) is coupled to a complementary transistor MPi 503 (p-channel transistor). The gate of MNi 501 is coupled to the output of the previous stage 507 (or the input signal in the case of the first stage). The gate of the MPi transistor 503 is coupled to the clock signal 505. The source of MPi 503 is connected to $V_{dd}$ and the source of MNi 501 is connected to ground. Also shown is a reset transistor MNRi 519 which operates in a similar manner as described in FIG. 1. The enhanced circuit design also includes transistor MNSi 513 connected in series to a capacitor CSi 515. The source of the transistor MNSi 513 is connected to the output of the stage $V_i$ 517 and the capacitor 515 is connected to the clock signal 505. The gate of MNSi 513 is connected to primary input $V_{in}$ 521. MNSi 513 can also be replaced by a transistor network corresponding the required logic function and all the gates of the transistors will be connected to the primary input signal. The operation of MNSi 513 has two important functions. First, because MNSi 513 is connected in series between the output $V_i$ 517 and the CSi 515, the effective load capacitance is larger when MNSi 513 is on. The larger load makes $V_i(t)$ rise slower than the CVTL logic described without the additional transistor. When MNSi 513 is on, the falling edge of the clock draws charge away from the output which makes $V_i(t)$ 517 smaller. The smaller $V_i(t)$ makes the next stage output rise faster. The ultimate result of the inclusion of the additional transistor is dependent on the size of MnSi 513 and CSi 515. The amount of charge drawn from the load is proportional to CSi and the period of time required to draw charge is inversely proportional to the β of MNSi 513. If MNSi 513 and CSi 515 are selected large enough then the maximum value of $V_i(t)$ is less than $V_{in}$ and $V_{i+1}$ rises at nearly the same rate time and rate as V0. The delay of the output signal is therefore dominated by the delay of the first inverter. If MNSi is much smaller (e.g., 10 times as small) than MNSi and CSi is much smaller (e.g., 5 times as small) than the load inverter i, then the rising speed $V_{i+}$can be made nearly as fast as $V_{i-}(t)$, which makes the delay from inverter i−1 to inverter i+1 several orders of magnitude smaller than the delay of the first inverter.

The transistor characteristcs (e.g., $V_t$, K') in the chain of inverter stages should match as closely as possible. Although in the CMOS manufacturing process the transistor's βs in the same chip are very similar, a small variation among the transistors is likely to occur. If the β of the NFET inverter stage i is enlarged and is a primary input to the next inverter stage, the enlarged β makes the critical voltage smaller which makes the inverter output drop below $V_c$ before switching high. Thus, it rises slower than a perfectly matched circuit. The next inverter therefore has a critical voltage larger than $V_c$. The distorted signal is amplified in the later inverter stages and the delay between two inverters in the chain increases.

Figure 6:
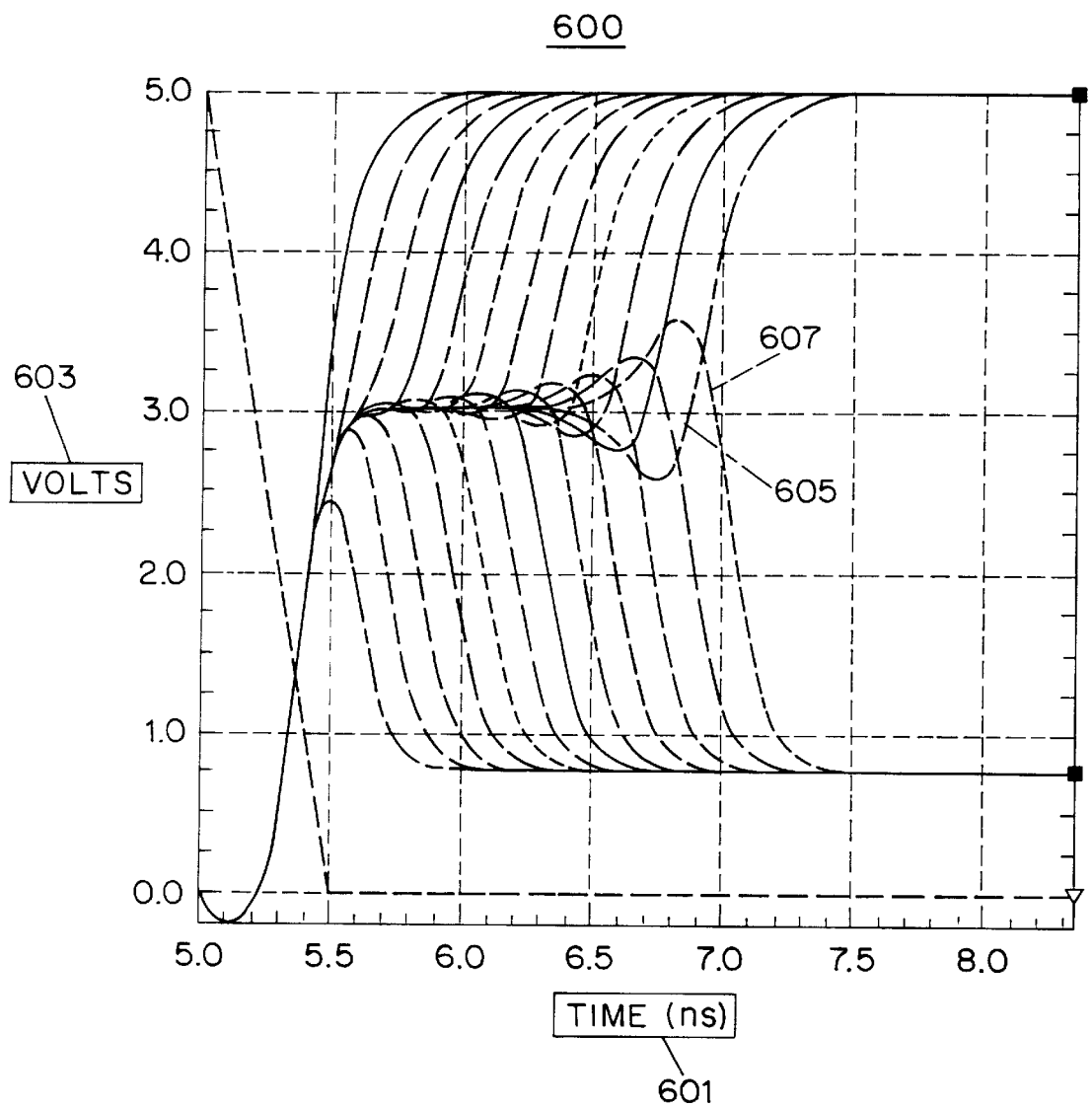
FIG. 6 is a graph which illustrates the effect of amplified distortion in an inverter chain.

FIG. 6 shows a graph 600 of the effect of the amplified distortion in an inverter chain with unmatched transistors. The horizontal axis 601 is time and the vertical axis 603 is the output voltage for each stage in the inverter chain. Signals 605 and 607 show later CVTL stages in the inverter chains which first dip below or above the $V_c$ line before they reach their logical high or low state. In order to correct for the distortion, an enhanced CVTL stage is used in strategic places in the chain in order to realign the output voltage of the particular enhanced stage. One example of a selected placement is to place two enhanced inverters together in the center of the chain in order to correct for the distortion caused by the transistors β mismatch. One enhanced inverter is required to balance each of the logic states; one for the low state and one for the high state.

Figure 7:
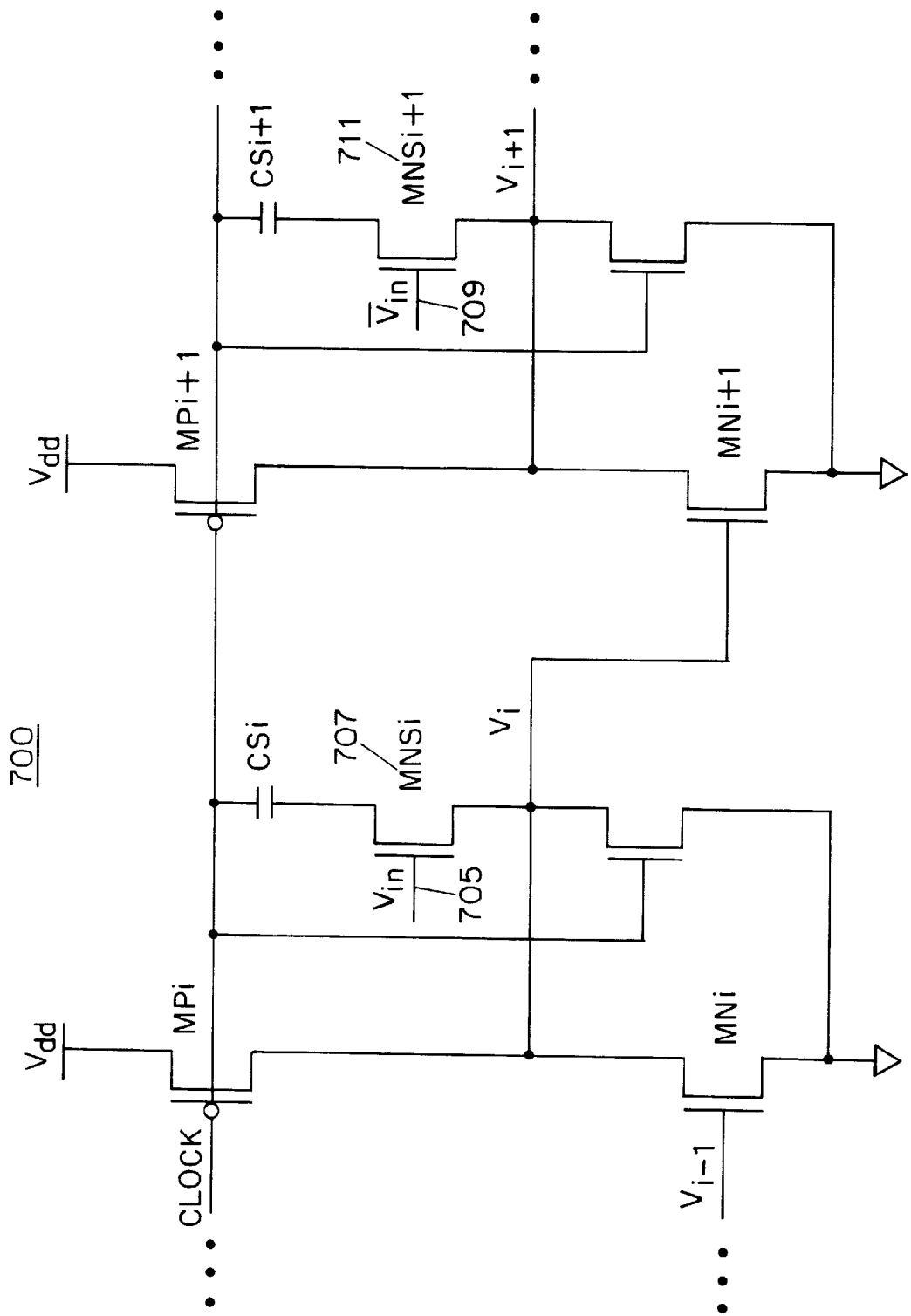
FIG. 7 is a schematic diagram of multiple CVTL stages which are used to reduce distortion in an inverter chain.

FIG. 7 shows two CVTL enhanced stages which can be used in an inverter chain 700. Stage 701 shows the input value $V_{in}$ 705 being inputted to the additional transistor 707 which helps to stabilize the critical voltage $V_c$ for the inverter stage. This configuration helps stabilize an output of logic high value. Stage 703 has a complement input $V_{in}$ 709 connected to additional transistor 711 which helps stabilize the stage output to a logic low value. The presence of both enhanced stages are required in order to stabilize both logic states existing in the inverter chain. Enhanced inverters can be placed sparingly in an inverter chain at periodic places to control the distortion. After each enhanced inverter, the output of the inverter after reset is restored to the proper $V_c$ and thus distortion is minimized going forward in the chain.

The CVTL logic device can be easily modified in order to create circuit applications using its faster CMOS technology. The transistor MNi can be replaced with a NFET network in order to accomplish other desired functions. The remaining CVTL logic design remains the same. One example of an embodiment of a circuit using the CVTL design is a buffer circuit. A buffer is an important amplifying device in a digital circuit which has a low input capacitance and is capable of driving large capacitance load. Typical buffer applications include acting as drivers for the address lines and the row select lines of memory elements in a conventional memory chip. The relatively high load capacitance of memory elements can make the time it takes to access memory relatively long. The traditional buffer uses conventional inverters in a chain with the inverter sizes proportionately enlarged along the chain to enable driving the ultimate large load capacitance. An improved buffer can be created using the new CVTL circuit structure. The CVTL devices operate optimally if the size ratio of the PFET transistor of inverter i to the NFET transistor of the inverter i+1 is a constant ∀i so that the rising rates are the same for all the outputs of the inverter stages. It is also beneficial to maintain the same size ratio of PFET to NFET within the same inverter stage for all of the inverters so that the critical voltage is the same in all the inverter stages. The size of each inverter stage (for all MPi, MNi and MNRi) can be a multiple of the size of the previous inverter stages in the chain while maintaining the above conditions to increase the driving capability of the chain.

An example of ratios used to set the multiple between the size of transistors in adjacent stages is a value of two. The widths of the transistors MP0 and MN0 in the first stage can be 4 μm and 2 μm respectively. The inverters in the chain are then subsequently sized up by a power of two to reach 512 μm to drive the final load inverter with the width of PFET 512 μm and NFET 256 μm which has about 1.3 pf input capacitance (the load capacitance of the CVTL buffer). The buffer chain in this example thus has eight inverters, and enhanced inverters as previously described are used in the fourth and fifth positions in the chain to minimize distortion and reduce delay. The widths of all the MNSi transistors is 4 μm, and the capacitance of the CS capacitors are 50 ff. The equivalent input capacitance of the CVTL buffer is about 20 ff.

The delay of the circuit using the CVTL buffer is 0.43 ns as modeled using SPICE, a circuit modeling program. The delay of a conventional CMOS buffer for the same load is 2.8 ns as modeled on SPICE. Thus, conventional buffer circuits with similar characteristics has 5.6 times the delay of the new CVTL circuit.

The delay between stages in the buffer in this example can be further reduced if the size of MNSi and CSi are further enlarged thus conditioning the voltage to the critical voltage quicker. However, by enlarging those values the input capacitance of the buffer is also increased because the input is coupled to the enhanced transistors. Therefore, a balance must be struck between the minimization of delays in the inverter stages (and thus the speed of the circuit) and the input capacitance.

The CVTL buffer as described above can be used to drive an interconnect line between devices in an improved manner where the RC delay is significant. For example, a conventional metal line with a resistance of 1 Ω/μm and a capacitance of 0.04 ff/μm with a 5 pf load distributed along the 1 cm line has an RC delay of 2.7 ns according to the Elmore delay model, which is known in the art. One way to reduce the RC delay is to partition the distributed load into several load groups. Each group is driven by a separate input buffer which is designed to have a small capacitance. The long interconnected line is composed of distributed resistance, distributed capacitance and the input capacitance of the buffer. Therefore, the sum of the RC products for the interconnect is reduced compared to the case where there is only one buffer driving a long line.

Figure 8:
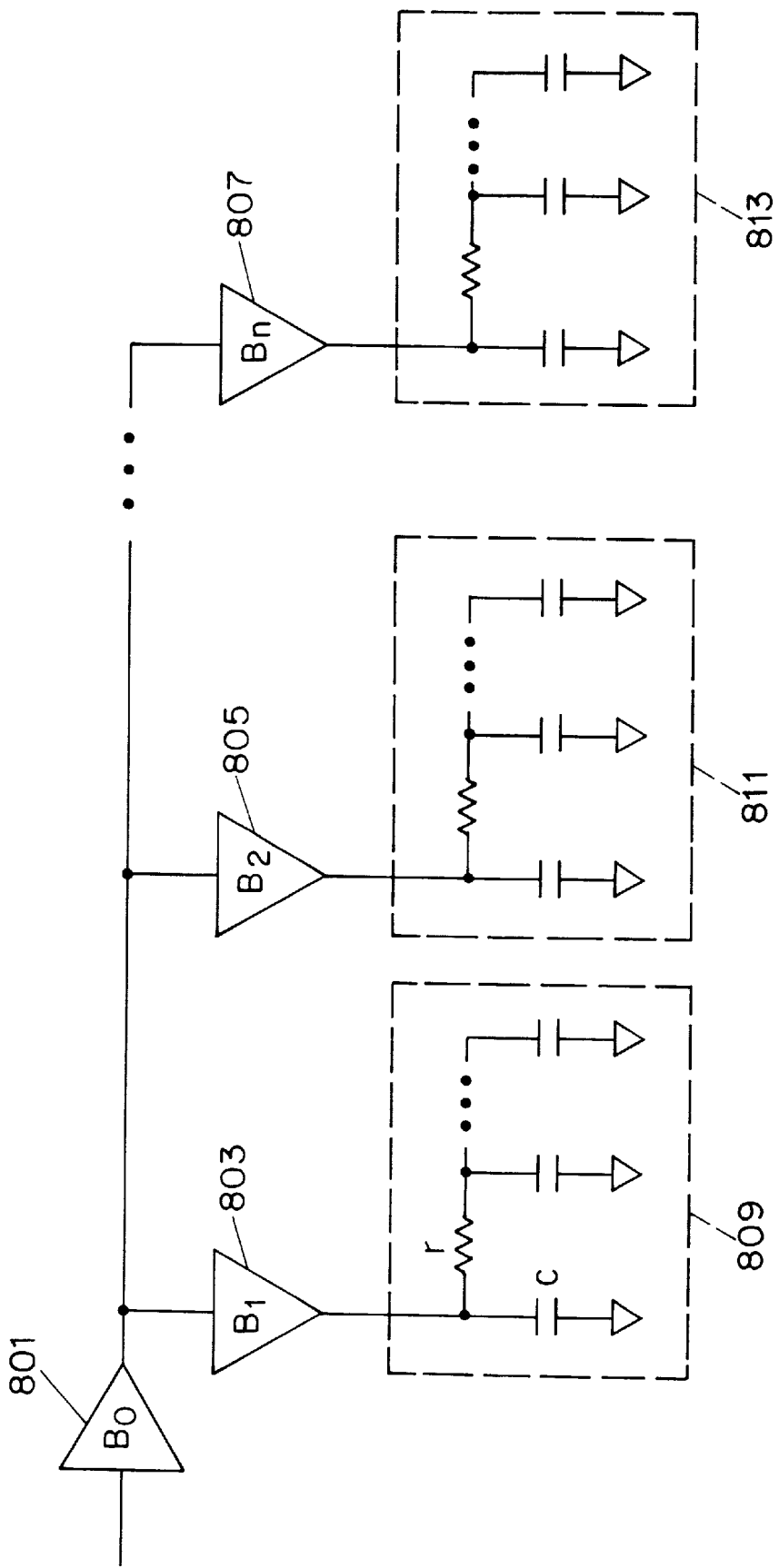
FIG. 8 is a schematic diagram of a buffer circuit with a distributed load.

FIG. 8 is a schematic diagram for a buffer with a distributed load which utilizes the CVTL logic to reduce delay. First buffer 801 can be implemented with the CVTL circuit as described above. Distributed loads 809, 811 and 813 have corresponding distributed buffers 803, 805 and 807. These may also be CVTL buffers. The RC delay of the line is reduced proportionate to the square of the number of distributed loads because of the nature of RC delay. The initial buffer 801 is required when the load is extremely large or the required input capacitance is smaller than the sum of the input capacitances of the distributed buffers. The buffer can amplify the input signal through the series of stages. When the buffer 801 is constructed as CVTL, the clock input must have a phase equal to or ahead of the clocks of the other buffers to make the signal propagate properly. If the phase difference is large enough, the signal will pass without distortion because the inputs of the distributed buffers will reach their steady states before the clock edge arrives. The clocks can be distributed by having the clock of the first buffer in the chain drive the clock input of the next buffer in the chain and continue in this manner. The clock signal can also be processed through its own chain of inverters to effectively space the clock pulses.

Figure 9:
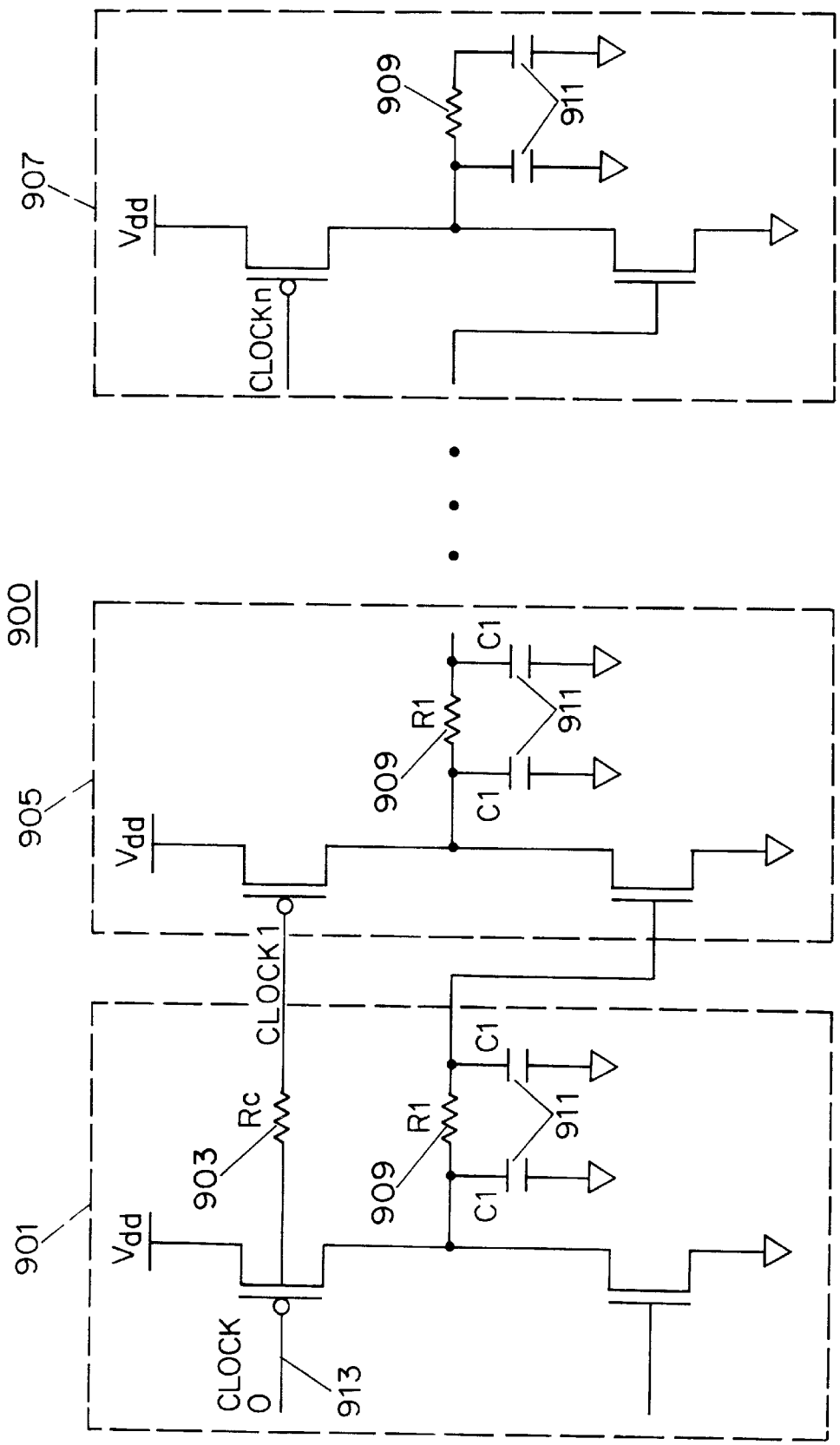
FIG. 9 is a schematic diagram of part of the CVTL circuit which is used in conjunction with the distributed load buffer circuit of FIG. 8.

FIG. 9 shows a schematic diagram 900 of the CVTL stages 901, 905 and 907 which are used in a distributed load buffer. Stage 901 includes the first portion of the load which is driven directly by the clock pulse 913. The RC circuit delays the clock pulse to the next stage 903 so that the load is already stabilized at the critical voltage before being affected by the output of the first stage 901. Rc 903 is the distributed clock line resistance, R1 909 is the distributed load line resistance and C1 911 is the load plus the distributed line capacitance. The delay in the propagation of voltage outputs are offset by the delay in the clock pulses for processing each stage. Additional inverters can be connected to the beginning of the buffer and these inverters do not have a lossy line effect when place near to one another. The reduction in delay due to the CVTL circuits directly reduces the delay in the overall circuit.

The DC power required to run the CVTL circuits can be minimized by using non-overlapping clocks to drive the MPi and MNRi transistors. When there is no clock pulse driving the MPs (the clock is high), there is no DC current generated from the MPs. When the clock pulse ends, all the results are latched. Since all the gates initially rise to $V_c$, the dynamic energy dissipated in one clock cycle may be more than in the conventional dynamic gate. The CVTL is therefore preferable in designs which require greater speed. However, the energy-delay tradeoff is still favorable overall when compared to conventional static or dynamic CMOS.

Another embodiment of a circuit which can effectively use the CVTL circuits is a ripple carry adder. A ripple carry adder architecture has high area efficiency and is easy to design. However, normally the ripple carry adder has excess delays if a large number of bits are being processed. The CVTL can be used in the design to reduce this delay and make the ripple carry adder more efficient.

Figure 10:
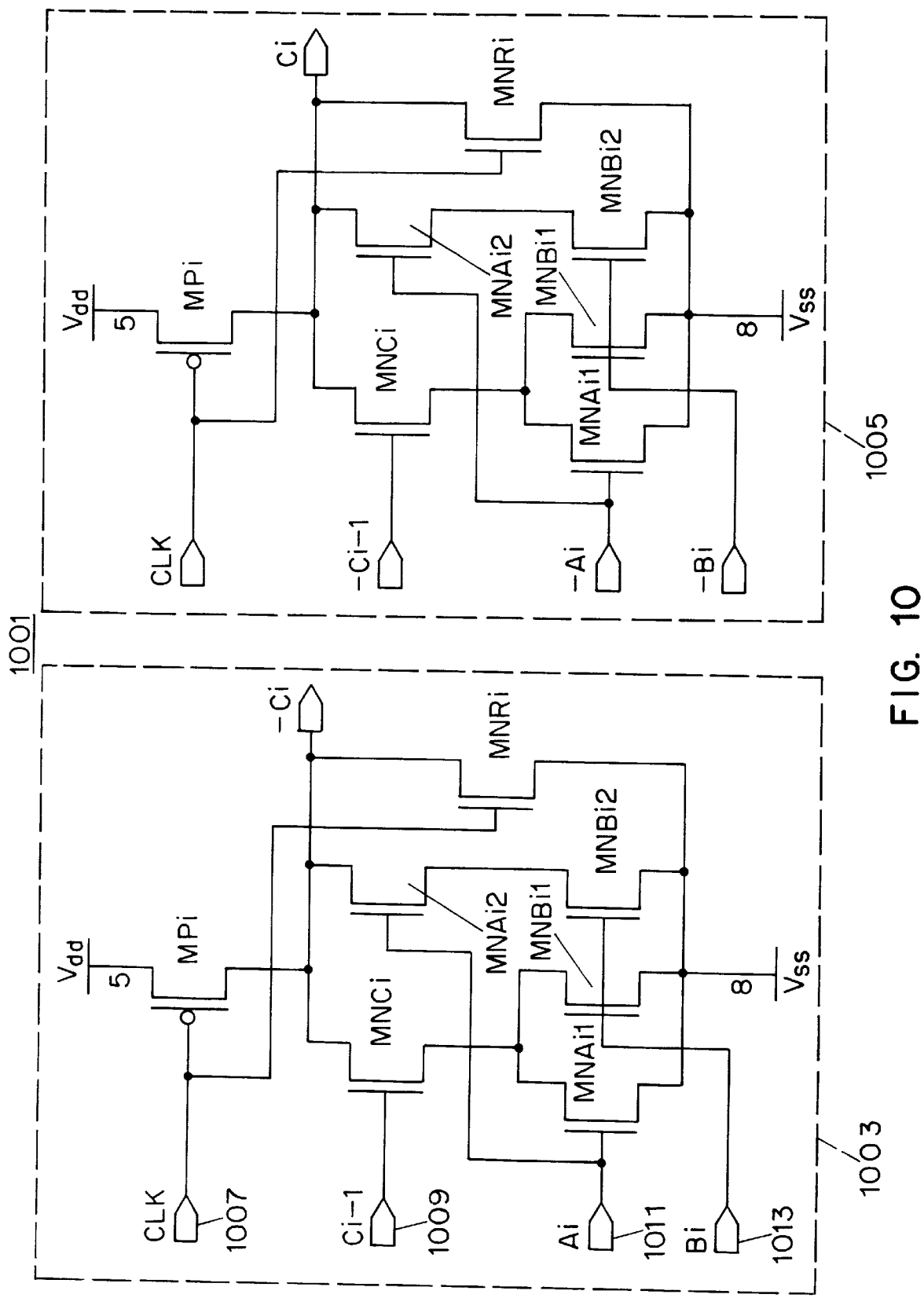
FIG. 10 is a schematic diagram of CVTL carry circuit used in a ripple carry adder.

FIG. 10 is a schematic diagram 1001 of a CVTL carry circuit for a ripple carry adder. The circuit 1003 is designed in the same manner as circuit 1005 which is used with inputs which are the complement of the inputs of circuit 1003. The clock 1007 drives the gate of one of the transistors in accordance with invention. The carry input C 1009 is the input value for the CVTL circuit. The output is preconditioned prior to the carry value determining the output state. The other values A 1111 and B 1113 are added together and the carry bit will be added to the sum of those two values. The carry circuit is applied to each bit in the carry adder circuit so that a pipelined design is optimal. The bits can be grouped into smaller portions of bits, e.g., eight bits per groups, and these circuit groups can be driven by previous groups in the pipeline. Thus the reduced delay from processing a chain of adders utilizing the CVTL design will speed up the overall process in the ripple carry adder circuit considerably. Other pipelined circuit architectures would also benefit from the use of the CVTL logic circuits.

Figure 11:
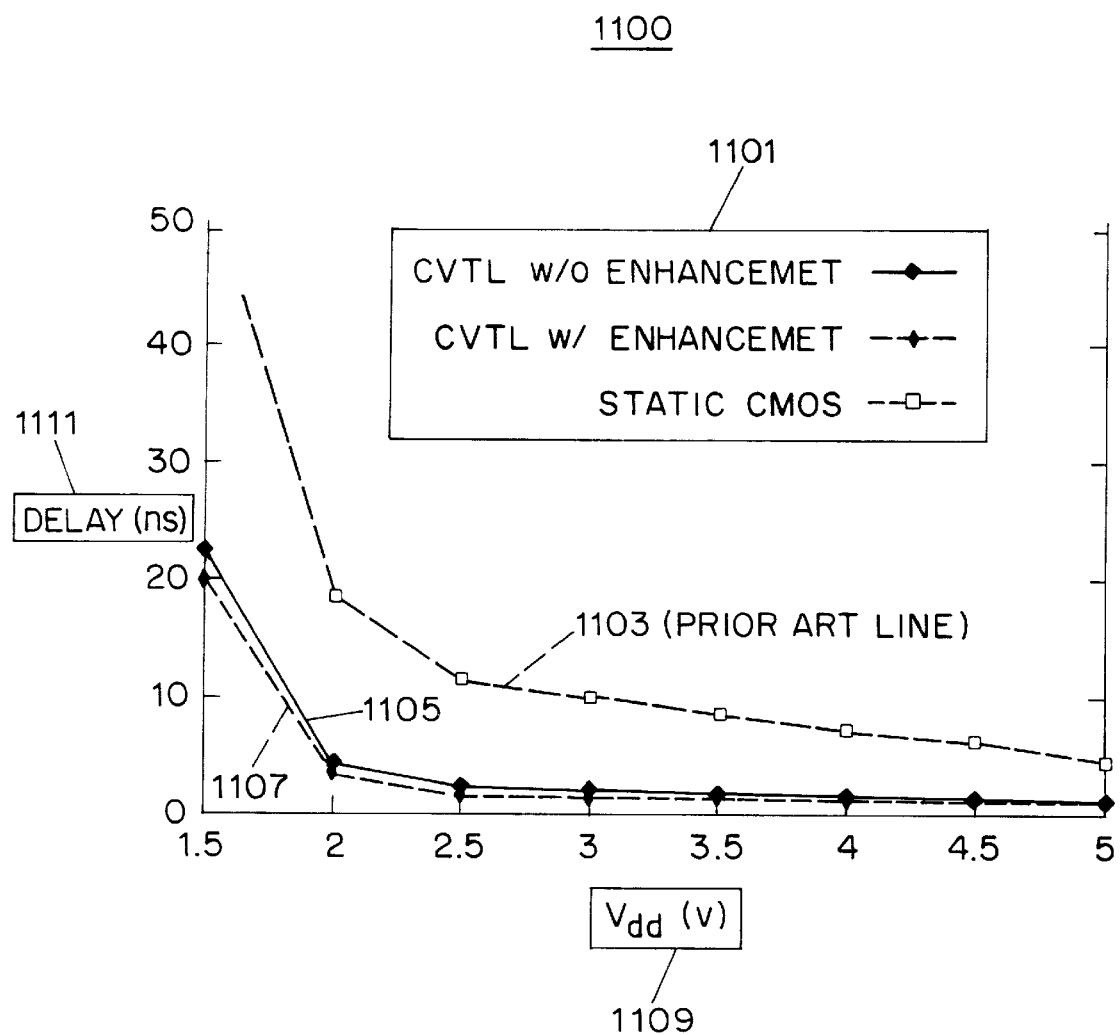
FIG. 11 is a graph of the delay of a CVTL buffer stage and a conventional CMOS stage as a function of $V_{dd}$.

FIG. 11 is a graph 1100 illustrating actual measurements made from a CVTL buffer constructed in accordance with FIG. 1. A CVTL buffer which embodies the CVTL design of FIG. 1 has been fabricated through MOSIS in the Orbit 2.0 µm technology. The CVTL buffer contains seven inverters with transistor widths from 8 µm (first inverter) to 512 µm (output inverter). An enhanced circuit was put in the $5^{th}$ inverter of the buffer to reduce the distortion and the delay when the input is high. There is no need for the enhanced circuit for the low input because of the circuit configuration. The width of the NFET of the enhanced circuit is 16 µm. A static buffer with the same input/output characteristics was designed and fabricated on the same IC for comparison. The load capacitance driven by both the CVTL and static buffers is approximately 10 pf (2 pf MOSIS pad and 8 pf probe). FIG. 11 shows the measured delay of the circuits as a function of the supply voltage ($V_{dd}$). The measurements of three circuits are shown, the delay for the conventional static CMOS circuit 1103, the delay for a CVTL circuit without enhancement 1105 and the delay with the enhanced 1107. Legend 1101 shows to which circuits the graph lines correspond. The vertical axis 111 in FIG. 11 is the measured delay and the horizontal axis 1109 is $V_{dd}$ for supply voltages between 1.5 V to 5 V. The measured delays differ from the simulations due to the distortion caused by the parasitic capacitance, inductance and resistance of the package and board. The performance of the conventional static circuit is degraded severely for low $V_{dd}$. When $V_{dd}$ equals 1.5 V, the CVTL buffer is still more than two times faster than the conventional static buffer. The CVTL circuit is four times faster than the conventional buffer with $V_{dd}$ equals 5 V, and the delay of CVTL has much less dependence on supply voltage (the slope of the curve in FIG. 11 is much smaller for CVTL compared to conventional CMOS).

Figure 12:
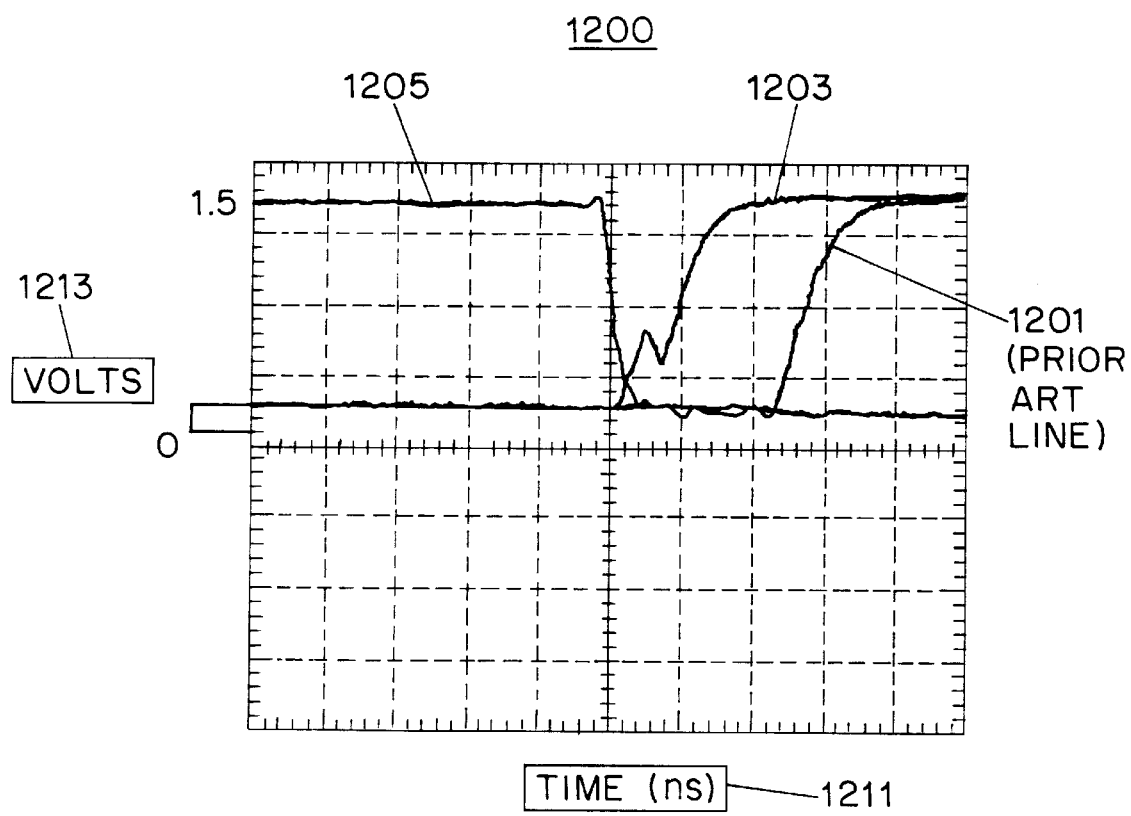
FIG. 12 is a graph of the voltage output of a CVTL buffer stage and a conventional CMOS stage for a selected $V_{dd}$.

FIG. 12 is a graph 1200 showing the output of a conventional static CMOS buffer 1201 and the output of a CVTL buffer including an enhanced circuit 1203. When the clock 1205 changes from a high to low state, the CVTL circuit reaches its logic high state much quicker than the conventional CMOS circuit. The CVTL output 1203 rises to its critical voltage immediately before processing the input signal and thus reduces delay in the circuit. The horizontal axis 1211 is time and the vertical axis 1213 is the output voltage of the stage. The graph was generated when $V_{dd}$ is 1.5 volts.

FIGS. 11 and 12 are representative of one example of a particular circuit configuration with specific transistor characteristics and particular logic levels and are used to show the benefits of CVTL logic over conventional logic circuits. Different graphs will be obtained for different CVTL circuits which embody the invention. FIGS. 11 and 12 are not intended to limit the invention in any way.

The foregoing merely illustrates the principles of the invention. It will thus be appreciated that those skilled in the art will be able to devise numerous systems, apparatus and methods which, although not explicitly shown or described herein, embody the principles of the invention and are thus within the spirit and scope of the invention as defined by its claims.

We claim:
1. A CMOS device comprising:
   a first transistor comprising, a first source node, a first gate node and a first drain node, wherein said first gate node is coupled to a clock signal;
   a second transistor, complementary to said first transistor, comprising a second source node, a second gate node and a second drain node, wherein said second drain node is coupled to said first drain node to form an output node and said second gate node is coupled to an input of said device; and
   a reset transistor coupled to said output node for resetting said output node to a low voltage,
   wherein said first transistor is responsive to said clock signal and said output node is charged to a critical voltage responsive to one of said transistors being turned on.
2. The CMOS device of claim 1, wherein said low voltage is zero.
3. The CMOS device of claim 1, wherein said reset transistors gate is coupled to said clock.

4. The CMOS device of claim 3, wherein said reset transistor is turned on prior to said input signal being processed in said device.

5. A CMOS device comprising:
a first transistor comprising a first source node, a first mate node and a first drain node, wherein said first gate node is coupled to a clock signal;
a second transistor, complementary to said first transistor, comprising a second source node, a second gate node and a second drain node, wherein said second drain node is coupled to said first drain node to form an output node and said second gate node is coupled to an input of said device; and
an additional transistor coupled to said output node for stabilizing said output node's voltage,
wherein said first transistor is responsive to said clock signal and said output node is charged to a critical voltage responsive to one of said transistors being turned on.

6. The CMOS device of claim 5, further including a capacitor coupled to said additional transistor.

7. The CMOS device of claim 5, wherein said additional transistor's gate is coupled to said input of said device.

8. A CMOS device comprising:
a first transistor comprising a first source node, a first gate node and a first drain node, wherein said first gate node is coupled to a clock signal; and
a second transistor, complementary to said first transistor, comprising a second source node, a second gate node and a second drain node, wherein said second drain node is coupled to said first drain node to form an output node and said second gate node is coupled to an input of said device,
wherein said first transistor is responsive to said clock signal and said output node is charged to a critical voltage responsive to one of said transistors being turned on, and
wherein said device is comprised in a ripple carry adder circuit.

9. A CMOS circuit comprising:
a plurality of circuit stages, including a first stage, each said stage comprising:
a first transistor comprising a first source node, a first gate node and a first drain node, wherein said first rate node is coupled a clock signal; and
a second transistor, complementary to said first transistor, comprising a second source node, a second gate node and a second drain node, wherein said second drain node is coupled to said first drain node to form an output node and said second gate node is coupled to an input of said stage,
wherein said first transistor is responsive to said clock signal and said output node is charged to a critical voltage when one of said transistors is turned on,
wherein each said stage except, said first stage, is coupled to a preceding stage's output node in said circuit to form a chain, and the circuit further comprises a reset transistor coupled to said output node of at least one of said stage for resetting said output node to a low voltage.

10. The CMOS circuit of claim 9, wherein said low voltage is zero.

11. The CMOS circuit of claim 9, wherein said reset transistor's gate is coupled to said clock.

12. The CMOS circuit of claim 11, wherein said reset transistor is turned on prior to said input signal being processed in at least one said stage.

13. A CMOS circuit comprising:
a plurality of circuit stages, including a first stage, each said stage comprising:
a first transistor comprising a first source node, a first gate node and a first drain node, wherein said first gate node is coupled to a clock signal; and
a second transistor, complementary to said first transistor, comprising a second source node, a second gate node and a second drain node, wherein said second drain node is coupled to said first drain node to form an output node and said second gate node is coupled to an input of said stage,
wherein said first transistor is responsive to said clock signal and said output node is charged to a critical voltage when one of said transistors is turned on,
wherein each said stage, except said first stage, is coupled to a preceding stage's output node in said circuit to form a chain, and further comprising an additional transistor coupled to said output node of at least one said stage for stabilizing said output node's voltage.

14. The CMOS circuit of claim 13, further including a capacitor coupled to said additional transistor.

15. The CMOS circuit of claim 13, wherein said additional transistor's gate is coupled to said input of said stage.

16. A CMOS circuit comprising:
a plurality of circuit stages, including a first stage, each said stage comprising:
a first transistor comprising a first source node, a first gate node and a first drain node, wherein said first gate node is coupled to a clock signal; and
a second transistor, complementary to said first transistor, comprising a second source node, a second gate node and a second drain node, wherein said second drain node is coupled to said first drain node to form an output node and said second gate node is coupled to an input of said stage,
wherein said first transistor is responsive to said clock signal and said first output node is charged to a critical voltage when one of said transistors is turned on,
wherein each said stage, except said first stage, is coupled to a preceding stage's output node in said circuit to form a chain and said chain serves as a buffer.

17. A CMOS circuit comprising:
a plurality of circuit stages, including, a first stage, each said stage comprising:
a first transistor comprising a first source node, a first gate node and a first drain node, wherein said first gate node is coupled to a clock signal; and
a second transistor, complementary to said first transistor, comprising a second source node, a second gate node and a second drain node, wherein said second drain node is coupled to said first drain node to form an output node and said second gate node is coupled to an input of said stage,
wherein said first transistor is responsive to said clock signal and said output node is charged to a critical voltage when one of said transistors is turned on,
wherein each said stage, except said first stage, is coupled to a preceding stage's output node in said circuit to form a chain and at least two said stages comprise different size transistors.

18. A CMOS circuit comprising:
a plurality of circuit stages, including a first stage, each said stage comprising:
a first transistor comprising a first source node, a first gate node and a first drain node, wherein said first gate node is coupled to a clock signal; and a second transistor, complimentary to said first transistor, comprising a second source node, a second gate node and a second drain node, wherein said second drain node is coupled to said first drain node to form an output node and said second gate node is coupled to an input of said stage, wherein said first transistor is responsive to said clock signal and said output node is charged to a critical voltage when one of said transistors is turned on, wherein each said stage, except said first stage, is coupled to a preceding stage's output node in said circuit to form a chain and said first transistor in each said state is approximately the same size as said second transistor in a next stage in said chain.

19. A CMOS circuit comprising:

a plurality of circuit stages, including a first stage, each said stage comprising:
- a first transistor comprising a first source node, a first gate node, and a first drain node, wherein said first gate node is coupled to a clock signal; and
- a second transistor, complimentary to said first transistor, comprising a second source node, a second gate node and a second drain node, wherein said second drain node is coupled to said first drain node to form an output node and said second gate node is coupled to an input of said stage,
- wherein said first transistor is responsive to said clock signal and said output node is charged to a critical voltage when one of said transistors is turned on,
- wherein each said stage, except said first stage, is coupled to a preceding stage's output node in said circuit to form a chain and each said stage operates as an inverter.

20. A CMOS circuit coupled to a logic high voltage source a logic low voltage source and including a plurality of stages, at least one said stage comprising:
- a first transistor coupled to a complementary second transistor, wherein said first transistor has a orate coupled to a clock input and said second transistor has a gate coupled to a voltage input, wherein at least one of said stage has an output preconditioned to a voltage value which is between said logic high and said logic low voltages before said stance's output is responsive to said voltage input, wherein said plurality of stages comprise a buffer.

21. A CMOS circuit coupled to a logic high voltage source and a logic low voltage source and including a plurality of stages, at least one said stage comprising:
- a first transistor coupled to a complementary second transistor, wherein said first transistor has gate coupled to a clock input and said second transistor has gate coupled to a voltage input, wherein at least one of said stage has an output preconditioned to a voltage value which is between said logic high and said logic low voltages before said stage's output is responsive to said voltage input and wherein said plurality of stages comprises and adder circuit.

* * * * *

UNITED STATES PATENT AND TRADEMARK OFFICE
CERTIFICATE OF CORRECTION

PATENT NO. : 5,999,019
DATED : December 7, 1999
INVENTOR(S) : Zheng Zhu et al.

Page 1 of 1

It is certified that error appears in the above-identified patent and that said Letters Patent is hereby corrected as shown below:

Title page,
[19], "Zheng et al." should read -- Zhu et al. --.
[75], "Zhu Zheng" should read -- Zheng Zhu --.

Column 6,
Line 2, "$V_{2i}i(t)$," should read -- $V_{2i}(t)$, --.
Line 60, "$V_{i+}$" should read -- $V_{i+1}$ --.
Line 61, "$V_i(t)$" should read -- $V_{i-1}(t)$ --.

Column 11,
Line 5, "mate" should read -- gate --.
Line 45, "rate" should read -- gate --.
Line 55, "stage except" should read -- stage, except --.

Column 13,
Line 12, "state" should read -- stage --.

Column 14,
Line 8, "orate" should read -- gate --.
Line 13, "stance's" should read -- stage's --.

Signed and Sealed this

Eighteenth Day of September, 2001

Attest:

NICHOLAS P. GODICI
Attesting Officer    Acting Director of the United States Patent and Trademark Office